United States Patent
Chan et al.

(10) Patent No.: US 8,723,183 B2
(45) Date of Patent: May 13, 2014

(54) IMAGE DISPLAY SYSTEM HAVING PIXELS WITH COMMON ELECTRODES

(75) Inventors: Chuan-Yi Chan, Taipei (TW); Chang-Ho Tseng, Taoyuan County (TW)

(73) Assignee: Chimei Innolux Corporation, Miao-Li County (TW)

( * ) Notice: Subject to any disclaimer, the term of this patent is extended or adjusted under 35 U.S.C. 154(b) by 1058 days.

(21) Appl. No.: 12/113,991

(22) Filed: May 2, 2008

(65) Prior Publication Data

US 2008/0272703 A1    Nov. 6, 2008

(30) Foreign Application Priority Data

May 3, 2007  (TW) ................................ 96115707 A

(51) Int. Cl.
  *H01L 29/04*     (2006.01)
(52) U.S. Cl.
  USPC ............................................ 257/72; 257/59
(58) Field of Classification Search
  USPC ........... 315/169.1, 169.2, 169.3; 345/204, 55, 345/76, 77, 92, 93, 103; 257/59, 72, 257/347–35, 347–354
  See application file for complete search history.

(56) References Cited

U.S. PATENT DOCUMENTS

| | | | |
|---|---|---|---|
| 6,437,839 B1* | 8/2002 | Cacharelis | 349/39 |
| 6,777,886 B1* | 8/2004 | Lo et al. | 315/169.1 |
| 7,800,572 B2* | 9/2010 | Kumeta et al. | 345/96 |
| 2006/0038931 A1* | 2/2006 | Na | 349/42 |
| 2006/0050035 A1* | 3/2006 | Leo et al. | 345/89 |

* cited by examiner

*Primary Examiner* — Ori Nadav
(74) *Attorney, Agent, or Firm* — McClure, Qualey & Rodack, LLP

(57) ABSTRACT

A pixel driving circuit array is disclosed, comprising a first capacitor and a second capacitor. The first capacitor comprises a first electrode, an insulator layer and a common electrode. The second capacitor comprises a second electrode, the insulator layer and the common electrode. The first capacitor and the second capacitor share the same common electrode. The first electrode and the second electrode are on the same plane.

13 Claims, 11 Drawing Sheets

US 8,723,183 B2

IMAGE DISPLAY SYSTEM HAVING PIXELS WITH COMMON ELECTRODES

BACKGROUND OF THE INVENTION

1. Field of the Invention

The invention relates to a pixel driving circuit array, and in particular relates to a plurality of capacitors sharing one pixel driving circuit array.

2. Description of the Related Art

Organic light emitting diode (OLED) displays that use organic compounds as a lighting material for illumination are flat displays. The advantages of the OLED displays are that they have smaller sizes, lighter weights, wider viewing angles, higher contrast ratios and faster speeds.

Recently, higher display resolution has been one technological area, which has seen developmental improvement. Specifically, given a fixed display panel size, a display panel requires a greater amount of pixels for higher resolutions. Thus, continued miniaturization of a pixel circuits is required for higher resolution applications. Namely, it has become more of a priority to develop a system for reduced sized pixel circuits.

BRIEF SUMMARY OF THE INVENTION

A detailed description is given in the following embodiments with reference to the accompanying drawings.

An embodiment of a pixel driving circuit array is provided. The pixel driving circuit array comprises a plurality of pixel driving circuits. Each pixel driving circuit comprises a first capacitor and a second capacitor. The first capacitor comprises a first electrode and a common electrode. The second capacitor comprises a second electrode and the common electrode. The common electrode extends along a horizontal direction.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
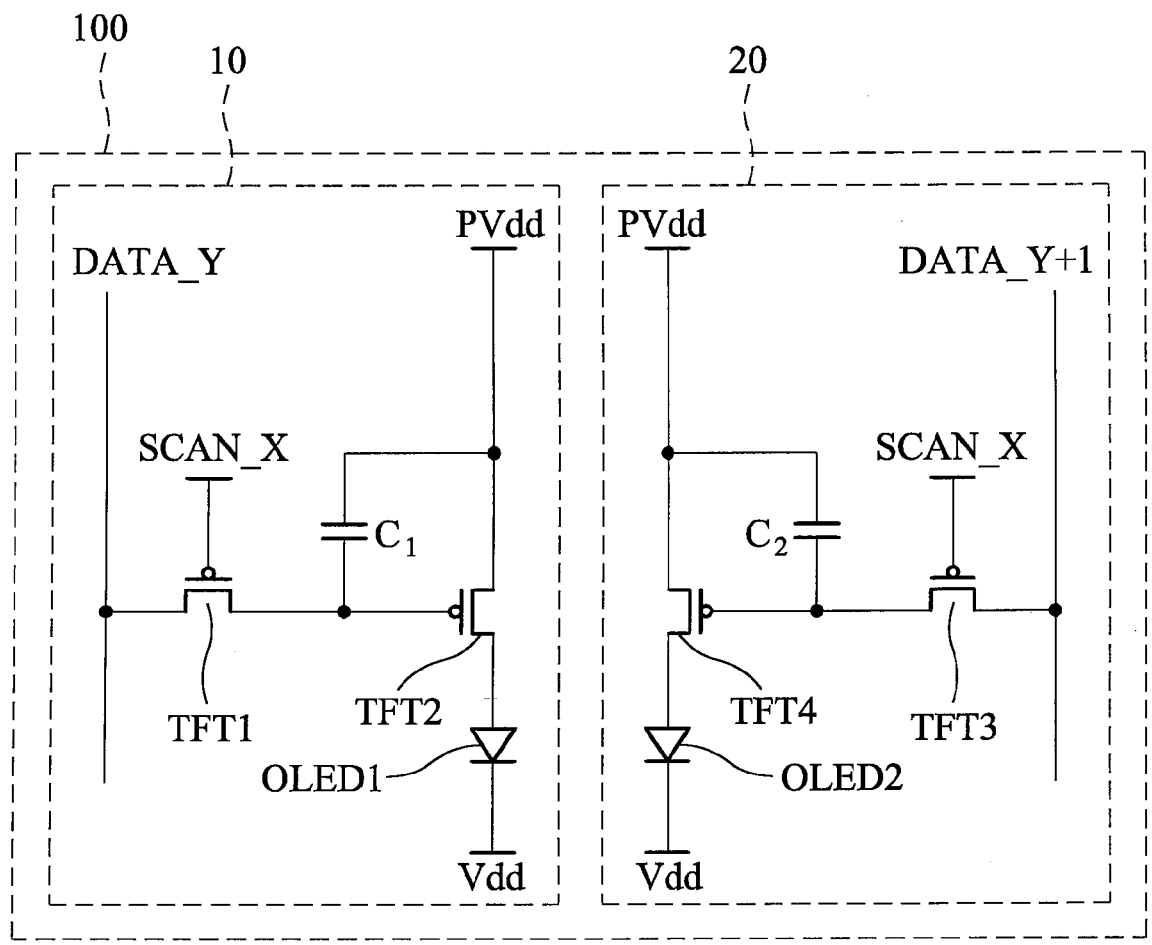
FIG. 1 shows 2T1C pixel driving circuits according to an embodiment of the invention.

FIG. 1 shows 2T1C pixel driving circuits 10 and 20 according to an embodiment of the invention. Each 2T1C pixel driving circuit has two thin film transistors and one capacitor. The pixel driving circuits 10 and 20 can be one part of a pixel driving circuit array 100. The pixel driving circuit 10 comprises transistors TFT1 and TFT2, light emitting unit OLED1, and capacitor C1. The pixel driving circuit 20 comprises transistors TFT3 and TFT4, light emitting unit OLED2, and capacitor C2. When a scanning signal SCAN_X turns on the transistors TFT1 and TFT3, data signals DATA_Y and DATA_Y+1 are respectively loaded to the gates of the transistors TFT2 and TFT4 and stored into the capacitors C1 and C2. The transistors TFT2 and TFT4 are turned on according to the data signals DATA_Y and DATA_Y+1. The current will flow from the voltage source PVdd through the transistors TFT2 and TFT4 and light emitting units OLED1 to the voltage source Vdd. When the current flows through the light emitting units OLED1 and OLED2, light is emitted, and vice versa.

Figure 2:
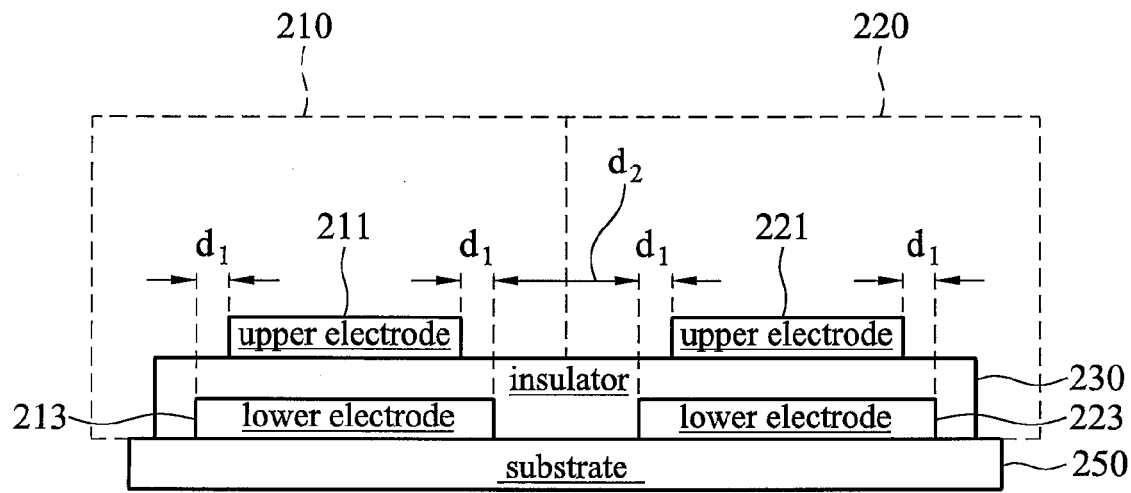
FIG. 2 shows a conventional cross diagram of two capacitors on a substrate.

FIG. 2 shows a conventional cross diagram of two capacitors on a substrate. The capacitors 210 and 220 are respectively corresponding to the capacitors C1 and C2 of FIG. 1. The capacitor 210 comprises an upper electrode 211, an insulator 230 and a lower electrode 213 and the capacitor 220 comprises an upper electrode 221, an insulator 230 and a lower electrode 223. The capacitors 210 and 220 are disposed on the substrate 250. The substrate 250 can be a glass substrate. Based on the layout rule limit, the upper electrode is usually smaller than the lower electrode. Thus, the upper electrode 211 is smaller than the lower electrode 213 and the upper electrode 221 is smaller than the lower electrode 223. As shown in FIG. 2, there is a minimum length d1 between one side of the upper electrode 211 and that of the lower electrode 213 in a projection direction according to the layout rule. Similarly, the minimum length d1 exists between one side of the upper electrode 221 and that of the lower electrode 223 in the projection direction according to the layout rule. In addition, there is a minimum length d2 between the lower electrodes 213 and 223 according to the layout rule. Thus, the minimum distance between the upper electrode 211 of the capacitor 210 and the upper electrode 221 of the capacitor 220 is (2*d1)+d2.

Figure 3:
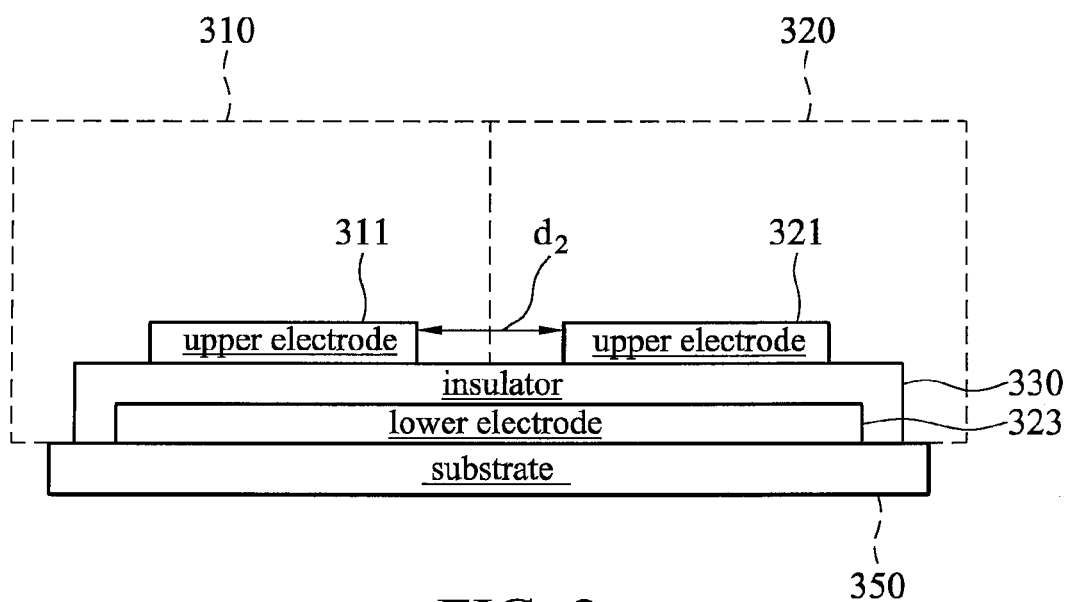
FIG. 3 shows a cross diagram of two capacitors on a substrate according to an embodiment of the invention.

FIG. 3 shows a cross diagram of two capacitors on a substrate according to an embodiment of the invention. The capacitors 310 and 320 are respectively corresponding to capacitors C1 and C2 of FIG. 1. The capacitor 310 comprises an upper electrode 311, an insulator 330 and a lower electrode 323 and the capacitor 320 comprises an upper electrode 321, the insulator 330 and the lower electrode 323. The capacitors 310 and 320 are disposed on the substrate 350. As shown in FIG. 3, capacitors 310 and 320 share the lower electrode 323 (common electrode) so the minimum distance between the upper electrodes 311 and 321 is d2. Thus, the minimum distance between the capacitors 310 and 320 of FIG. 3 is less than that between the capacitors 210 and 220 of FIG. 2 by 2*d1. Referring to FIG. 3 with FIG. 1, the lower electrode 323 is coupled to the voltage source PVdd which is a fixed voltage. The upper electrode 311 is coupled to the transistor TFT1 to receive the data signal DATA_Y and the upper electrode 321 is coupled to the transistor TFT3 to receive the data signal DATA_Y+1. Note that while two capacitors share one lower electrode, it is not limited thereto. Three capacitors can also share one lower electrode.

When the storage size of the capacitors C1 and C2 of the pixel driving circuits 10 and 20 are fixed (the overlap area of the upper electrode and the lower electrode are fixed), the sum of the area of the capacitors 310 and 320 of FIG. 3 is less than the sum of the area of the capacitors 210 and 220 of FIG. 2. Using the above layout method, the advantages are as follows: (1) the size of the pixel driving circuit is reduced, (2) the display panel achieves higher resolution, (3) the aperture ration is increased for bottom emission, and (4) more pixels are disposed in a fixed display area. In addition, by decreasing the size of the pixel driving circuits, the total display area for the light emitting unit OLED1 and OLED2 can be increased for brightness.

Figure 4:
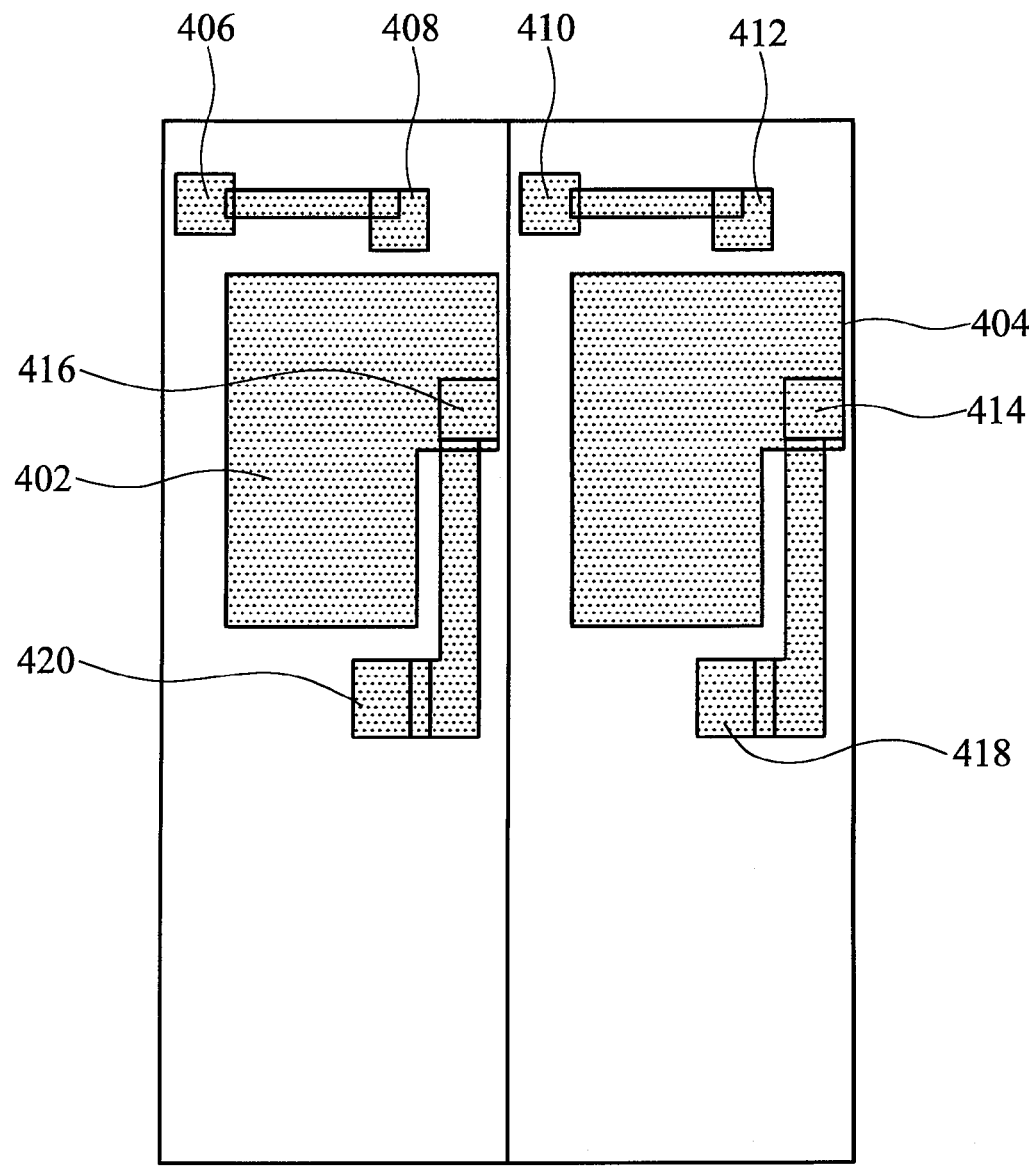
FIG. 4 shows a layout diagram of a Poly-Si layer of the pixel driving circuit, wherein the poly-Si layer is a first layer on the substrate.

FIG. 4 shows a layout diagram of a Poly-Si layer of the pixel driving circuit. The poly-Si layer is a first layer on the substrate. Referring to FIG. 1, the lower electrode 402 of the capacitor C1 and the lower electrode 404 of the capacitor C2 are separated. The areas 406 and 408 are respectively a source area and a drain area of the transistor TFT1. The areas 416 and 420 are respectively a source area and a drain area of the transistor TFT2. The areas 410 and 412 are respectively a source area and a drain area of the transistor TFT3. The areas 414 and 418 are respectively a source area and a drain area of the transistor TFT4.

Figure 5:
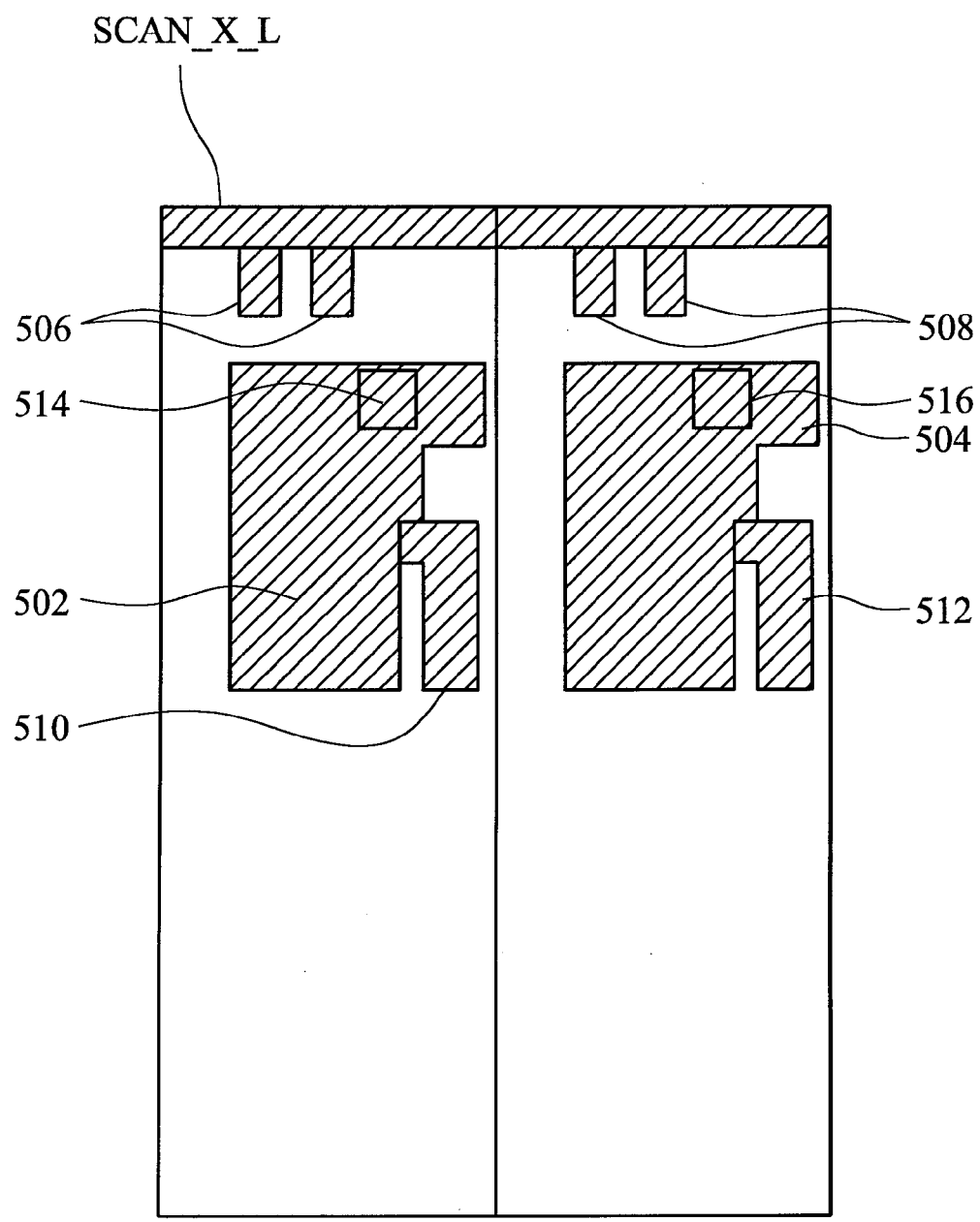
FIG. 5 shows a layout diagram of a first metal layer (Metal_1 layer) of the pixel driving circuit.

FIG. 5 shows a layout diagram of a first metal layer (Metal_1 layer) of pixel driving circuit. The first metal layer is a second layer on the substrate. The upper electrode 502 of the capacitor C1 and the upper electrode 504 of the capacitor C2 are separated. The areas 506 and 508 are respectively gate areas of the transistors TFT1 and TFT3. The areas 510 and 512 are respectively gate areas of the transistors TFT2 and TFT4. As shown in FIG. 5, the gate of the transistor TFT2 is coupled to the upper electrode 502 of the capacitor C1, and the gate of the transistor TFT4 is coupled to the upper electrode 504 of the capacitor C2. The area 514 is an electrical contact area of the transistor TFT1 and the capacitor C1. The area 516 is an electrical contact area of the transistor TFT3 and the capacitor C2. A scanning line SCAN_X_L is electrically coupled to the gate area 506 of the transistor TFT1 and the gate area 508 of the transistor TFT3.

Figure 6:
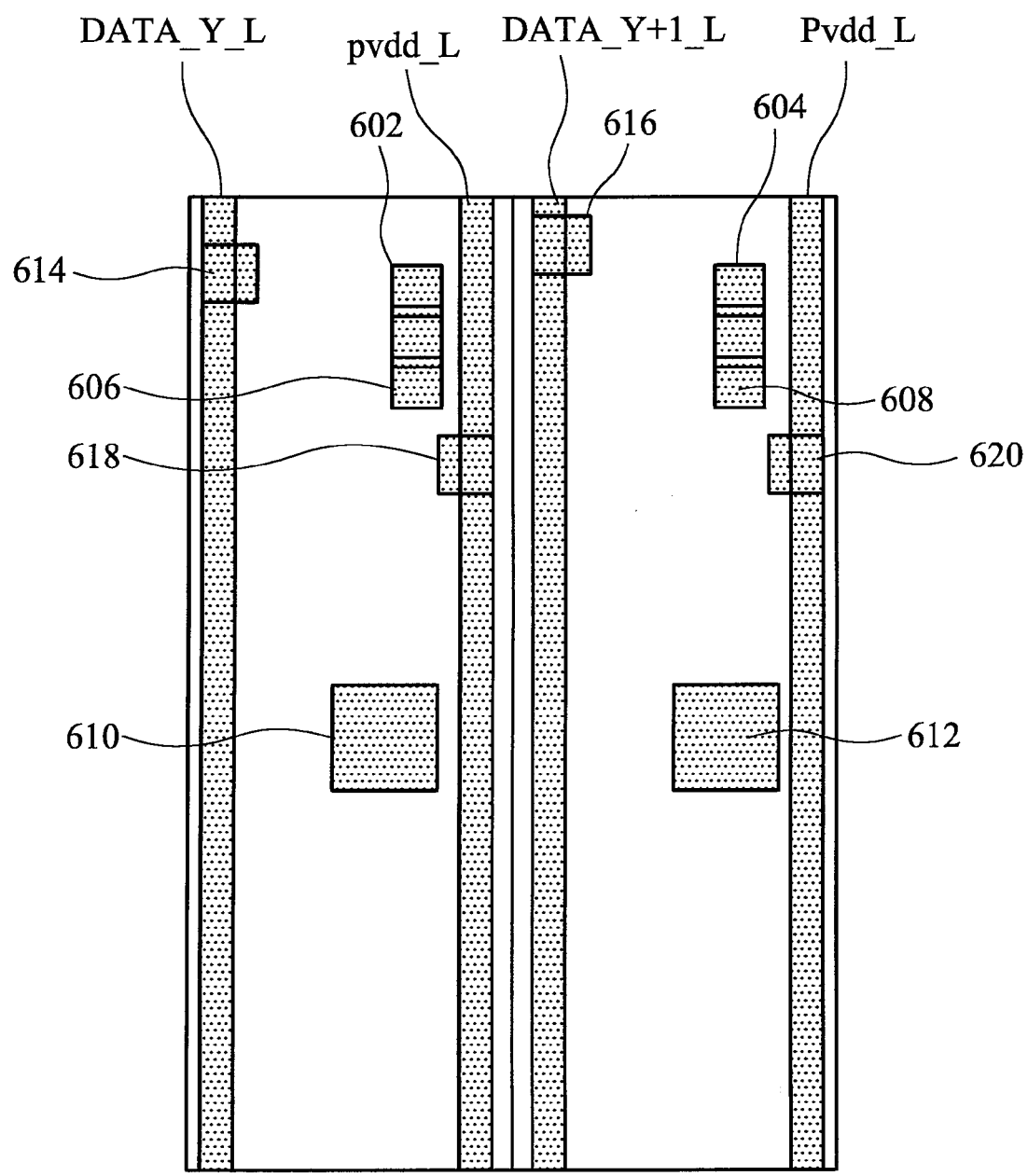
FIG. 6 shows a layout diagram of a second metal layer (Metal_2 layer) of the pixel driving circuit.

FIG. 6 shows a layout diagram of a second metal layer (Metal_2 layer) of the pixel driving circuit. The second metal layer is a third layer on the substrate. A data line DATA_Y_L is electrically coupled to the source area 406 of the transistor TFT1 through a metal area 614. A data line DATA_Y+1_L is electrically coupled to the source area 410 of the transistor TFT3 through a metal area 616. The voltage line PVdd_L is coupled to the source area 416 of the transistor TFT2 and the source area 414 of the transistor TFT4 respectively through metal areas 618 and 620. The metal areas 602 and 604 are respectively electrically coupled to the drain areas 408 and 412. The metal areas 606 and 608 are respectively electrically coupled to the areas 514 and 516. Thus, the drain of the transistors TFT1 is electrically coupled to the upper electrode 502 of the capacitor C1, and the drain of the transistor TFT3 is electrically coupled to the upper electrode 504 of the capacitor C2. The metal areas 610 and 612 are respectively electrically coupled to the drain area 418 of the transistors TFT2 and the drain area 420 of the transistors TFT4.

Figure 7:
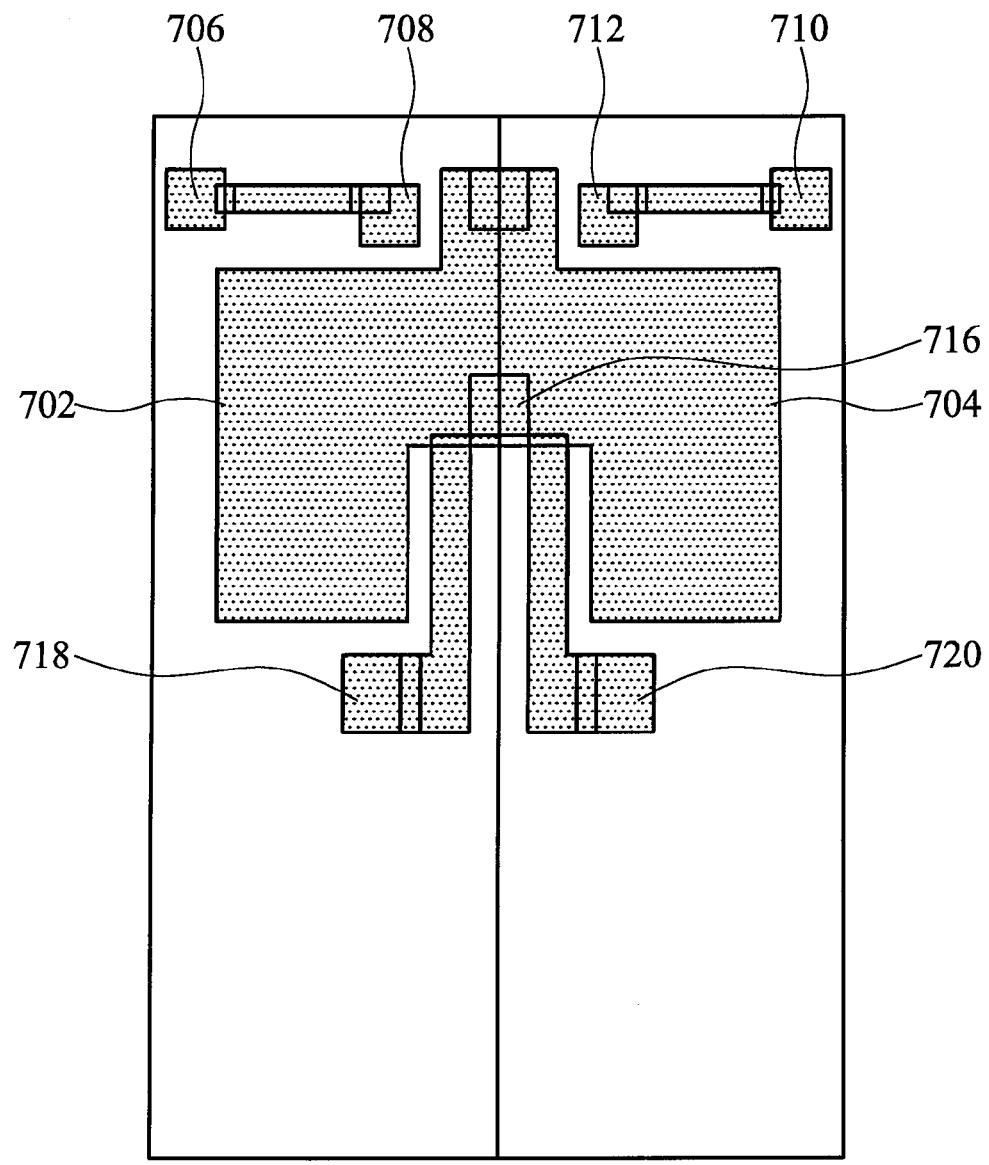
FIG. 7 shows a layout diagram of a Poly-Si layer of the pixel driving circuit according to an embodiment of the invention.

FIG. 7 shows a layout diagram of a Poly-Si layer of the pixel driving circuit according to an embodiment of the invention. The poly-Si layer is a first layer on the substrate. The lower electrodes 702 and 704 of the capacitor C1 are connected. Thus, the lower electrodes 702 and 704 comprise a common electrode of the capacitors C1 and C2. The areas 706 and 708 are respectively a source area and a drain area of the transistor TFT1. The areas 716 and 718 are respectively a source area and a drain area of the transistor TFT2. The areas 710 and 712 are respectively a source area and a drain area of the transistor TFT3. The areas 716 and 720 are respectively a source area and a drain area of the transistor TFT4.

Figure 8:
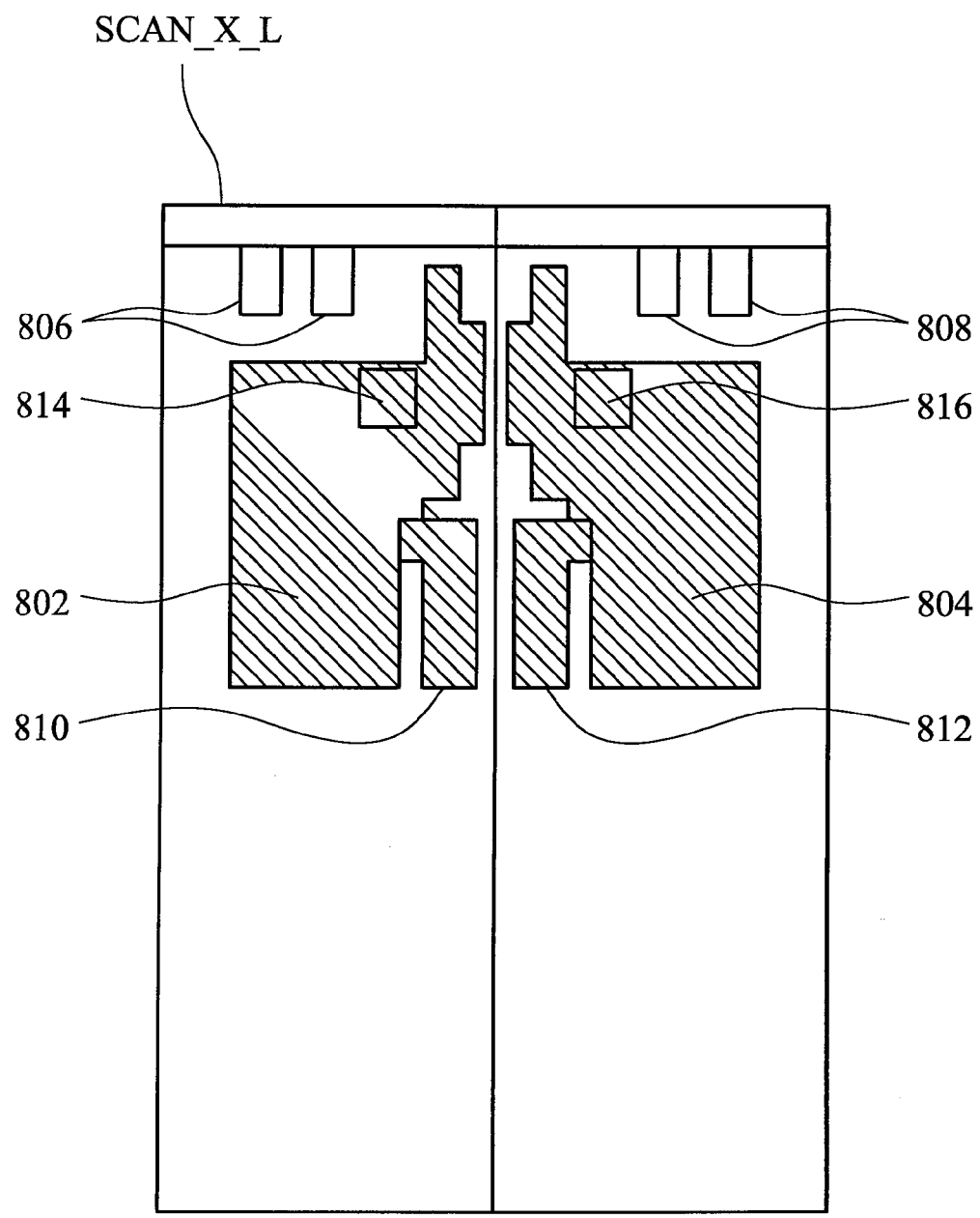
FIG. 8 shows a layout diagram of a first metal layer (Metal_1 layer) of the pixel driving circuit according to an embodiment of the invention.

FIG. 8 shows a layout diagram of a first metal layer (Metal_1 layer) of the pixel driving circuit according to an embodiment of the invention. The first metal layer is the second layer on the substrate. The upper electrode 802 of the capacitor C1 and the upper electrode 804 of the capacitor C2 are separated. The areas 806 and 808 are respectively gate areas of the transistors TFT1 and TFT3. The areas 810 and 812 are respectively gate areas of the transistors TFT2 and TFT4. As shown in FIG. 8, the gate area 810 of the transistor TFT2 is coupled to the upper electrode 802 of the capacitor C1 and the gate area 812 of the transistor TFT4 is coupled to the upper electrode 804 of the capacitor C2. The area 814 is an electrical contact area of the transistor TFT1 and the capacitor C1. The area 816 is an electrical contact area of the transistor TFT3 and the capacitor C2. A scanning line SCAN_X_L is electrically coupled to the gate area 806 of the transistor TFT1 and the gate area 808 of the transistor TFT3.

Figure 9:
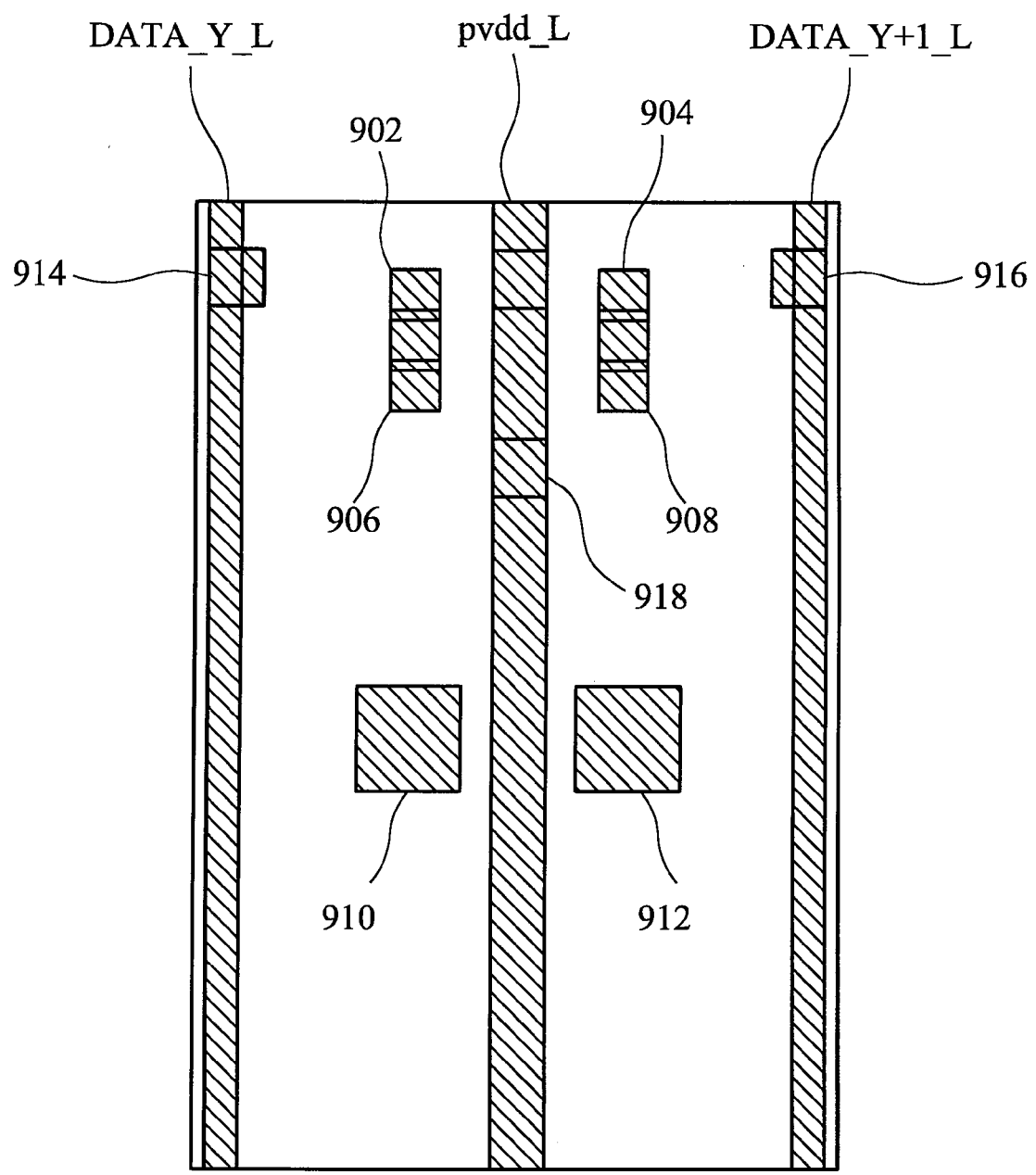
FIG. 9 shows a layout diagram of a second metal layer (Metal_2 layer) of the pixel driving circuit according to an embodiment of the invention.

FIG. 9 shows a layout diagram of a second metal layer (Metal_2 layer) of the pixel driving circuit according to an embodiment of the invention. The second metal layer is the third layer on the substrate. A data line DATA_Y_L is electrically coupled to the source area 706 of the transistor TFT1 through a metal area 914. A data line DATA_Y+1_L is electrically coupled to the source area 710 of the transistor TFT3 through a metal area 916. The voltage line PVdd_L are respectively coupled to the source area 716 of the transistor TFT2 and the source area 716 of the transistor TFT4 through metal areas 918. The capacitor 310 of the pixel driving circuit 10 and the capacitor 320 of the pixel driving circuit 20 share one voltage line PVdd_L to couple to the lower electrodes 702 and 704. The metal areas 902 and 904 are respectively electrically coupled to the drain areas 708 and 712 and the metal areas 906 and 908 are respectively electrically coupled to the areas 814 and 816. Thus, the drain of the transistors TFT1 is electrically coupled to the upper electrode 802 of the capacitor C1 and the drain of the transistor TFT3 is electrically coupled to the upper electrode 804 of the capacitor C2. The metal areas 910 and 912 are respectively electrically coupled to the drain area 718 of the transistors TFT2 and the drain area 720 of the transistors TFT4.

According to the above layout method, the first pixel driving circuit 10 and the second pixel driving circuit 20 are symmetrical in layout. The plurality of capacitors of the pixel driving circuits can share one electrode to reduce layout size. Following are four advantages of the layout method. The first advantage is that display resolution can be increased. The second advantage is that the aperture ration can be increased. The third advantage is that the capacitor can be enlarged given a fixed layout size. And the last advantage is that the original manufacturing process can be utilized.

Figure 10:
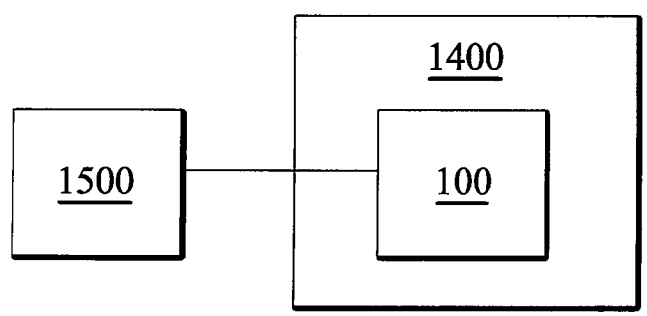
FIG. 10 schematically shows another embodiment of a system for displaying images according to the invention.

FIG. 10 schematically shows another embodiment of a system for displaying images according to the invention that, in this case, is implemented as a display panel 1400 or an electronic device 1600. As shown in FIG. 10, the display panel 1400 comprises the pixel driving circuit 100 of FIG. 1. The display panel 1400 can be a part of a variety of electronic devices (in this case, the electronic device 1600). Generally, the electronic device 1600 can comprise the display panel 1400 and a power supply 1500. Further, the power supply 1500 can be operatively coupled to the display panel 1400 and provide power to the display panel 1400. The electronic device 1600 can be a mobile phone, a digital camera, a PDA (personal data assistant), a notebook computer, a desktop computer, a television, or a portable DVD player, for example.

Figure 11:
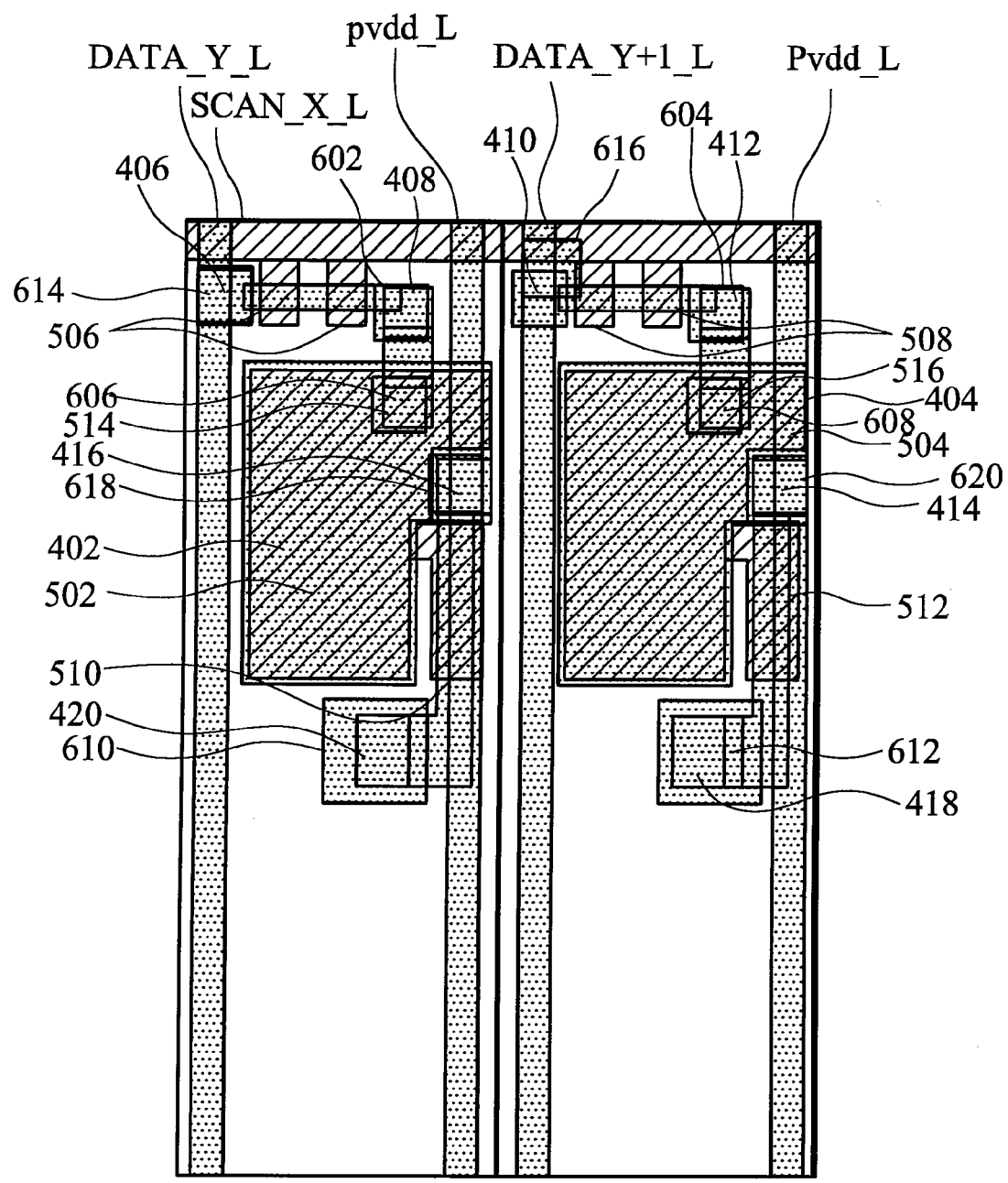
FIG. 11 shows a completed layout diagram of the pixel driving circuit.

FIG. 11 shows the completed layout diagram of a pixel driving circuit. FIG. 11 is an overlap layout diagram of the Poly-Si layer of FIG. 4, the first metal layer of FIG. 5 and the second metal layer of FIG. 6.

Figure 12:
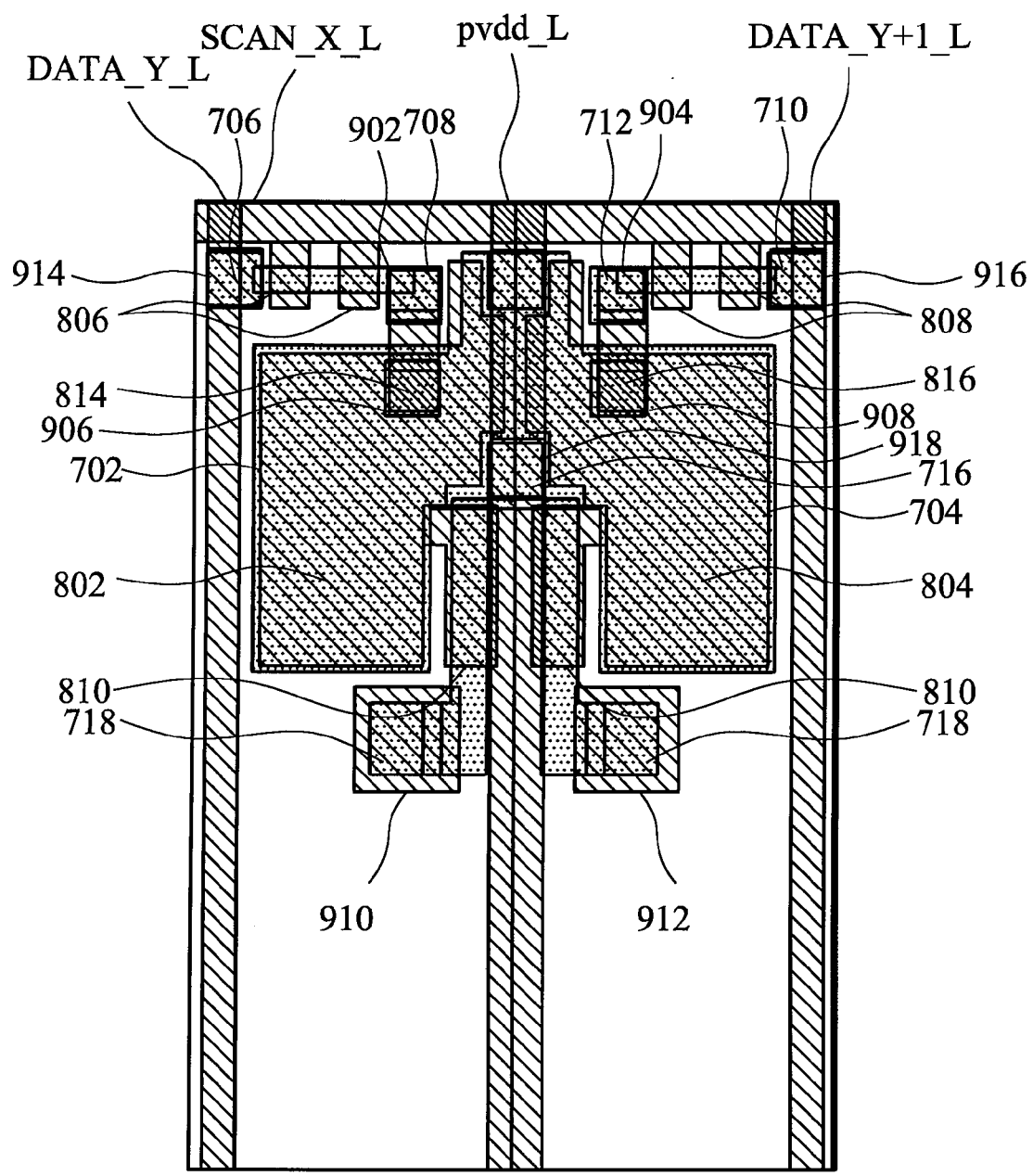
FIG. 12 shows a completed layout diagram of the pixel driving circuit according to an embodiment of the invention.

FIG. 12 shows the completed layout diagram of the pixel driving circuit according to an embodiment of the invention. FIG. 12 is also an overlap layout diagram of the Poly-Si layer of FIG. 7, the first metal layer of FIG. 8 and the second metal layer of FIG. 9.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An image display system, comprising:
   a pixel driving circuit array comprising a plurality of first pixels and a plurality of second pixels, wherein each of the first pixels comprises:
   a first capacitor comprising a first electrode and a common electrode; and wherein each of the second pixels comprises:
   a second capacitor comprising a second electrode and the common electrode, wherein the first pixels and the second pixels share a common voltage line, wherein the common voltage line is disposed between the first pixels and the second pixels and directly connected to the common electrode;
   a first direction along which the common voltage line is extended is perpendicular to a second direction in which the first pixels and the second pixels are arranged.

2. The image display system as claimed in claim 1, wherein the first capacitor is disposed at a first area, the second capacitor is disposed at a second area and the common electrode is disposed at both the first area and the second area.

3. The image display system as claimed in claim 1, wherein the first electrode and the second electrode are disposed on a first plane and the common electrode is disposed on a second plane.

4. The image display system as claimed in claim 1, wherein an insulator is disposed between the first electrode and the common electrode and between the second electrode and the common electrode.

5. The image display system as claimed in claim 1, wherein the common electrode receives a fixed voltage, the first electrode receives a first signal and the second electrode receives a second signal.

6. The image display system as claimed in claim 1, further comprising a third electrode, wherein the third electrode and the common electrode form a third capacitor.

7. The image display system as claimed in claim 1, wherein the first pixel driving circuit comprises the first capacitor and the second pixel driving circuit comprises the second capacitor.

8. The image display system as claimed in claim 1, wherein each of the first pixel driving circuit and the second driving circuit comprises two thin film transistors and one capacitor.

9. The image display system as claimed in claim 1, wherein the first pixel driving circuit comprises the first capacitor, a first transistor, a second transistor and a first light emitting unit and the second pixel driving circuit comprises the second capacitor, a third transistor, a fourth transistor and a second light emitting unit.

10. The image display system as claimed in claim 9, wherein the first capacitor of the first electrode and the second capacitor of the second electrode are the same size.

11. The image display system as claimed in claim 1, wherein the first capacitor and the second capacitor are disposed on a glass substrate.

12. The image display system as claimed in claim 1, further comprising a display panel, wherein the pixel driving circuit array forms a part of the display panel.

13. The image display system as claimed in claim 1, wherein the first pixel comprises a first pixel driving circuit; and wherein the second pixel comprises a second pixel driving circuit;
   wherein the first pixel driving circuit and the second pixel driving circuit are symmetrical to the common voltage line in layout.

* * * * *